US012772438B2

(12) United States Patent
Brewer et al.

(10) Patent No.: US 12,772,438 B2
(45) Date of Patent: Oct. 20, 2026

(54) STAGGERED HORIZONTAL CELL ARCHITECTURE FOR MEMORY DEVICES

(71) Applicant: Micron Technology, Inc., Boise, ID (US)

(72) Inventors: William M. Brewer, Boise, ID (US); Kyle B. Campbell, Boise, ID (US); Christopher Locke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1009 days.

(21) Appl. No.: 17/935,703

(22) Filed: Sep. 27, 2022

(65) Prior Publication Data

US 2024/0107748 A1 Mar. 28, 2024

(51) Int. Cl.
*H01L 27/108* (2006.01)
*H10B 12/00* (2023.01)

(52) U.S. Cl.
CPC ............. *H10B 12/36* (2023.02); *H10B 12/03* (2023.02); *H10B 12/056* (2023.02); *H10B 12/485* (2023.02)

(58) Field of Classification Search
CPC ...... H10B 12/36; H10B 12/03; H10B 12/056; H10B 12/485; H10B 12/05
See application file for complete search history.

(56) References Cited

U.S. PATENT DOCUMENTS 11,094,699 B1 8/2021 Brewer et al.
2011/0147848 A1* 6/2011 Kuhn ............... H01L 21/76229 257/E21.546

* cited by examiner

*Primary Examiner* — Mohammed R Alam
(74) *Attorney, Agent, or Firm* — Holland & Hart LLP

(57) ABSTRACT

Methods, systems, and devices for staggered horizontal cell architecture for memory devices are described. Generally, the described techniques provide for a memory device that supports staggered cell architectures and techniques to manufacture the memory device. The memory device may include a stack of materials including alternating layers of dielectric and conductive material. The memory device may include one or more staircase structures coupled with the stack of layers. The memory device may include access lines, such as bit lines, that are staggered according to a pattern, such as a serpentine pattern of dielectric fill surrounding the access lines. The memory device may include a set of repeatable structures that may be interlaced in a staggered configuration. The repeatable structure may include two fins extending in opposite directions and coupled to a respective staircase structure.

22 Claims, 9 Drawing Sheets

STAGGERED HORIZONTAL CELL ARCHITECTURE FOR MEMORY DEVICES

FIELD OF TECHNOLOGY

The following relates to one or more systems for memory, including a staggered horizontal cell architecture for memory devices.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., NAND, may maintain their stored logic state for extended periods of time even in the absence of an external power source. Volatile memory devices, e.g., DRAM, may lose their stored state when disconnected from an external power source.

DETAILED DESCRIPTION

Figure 1:
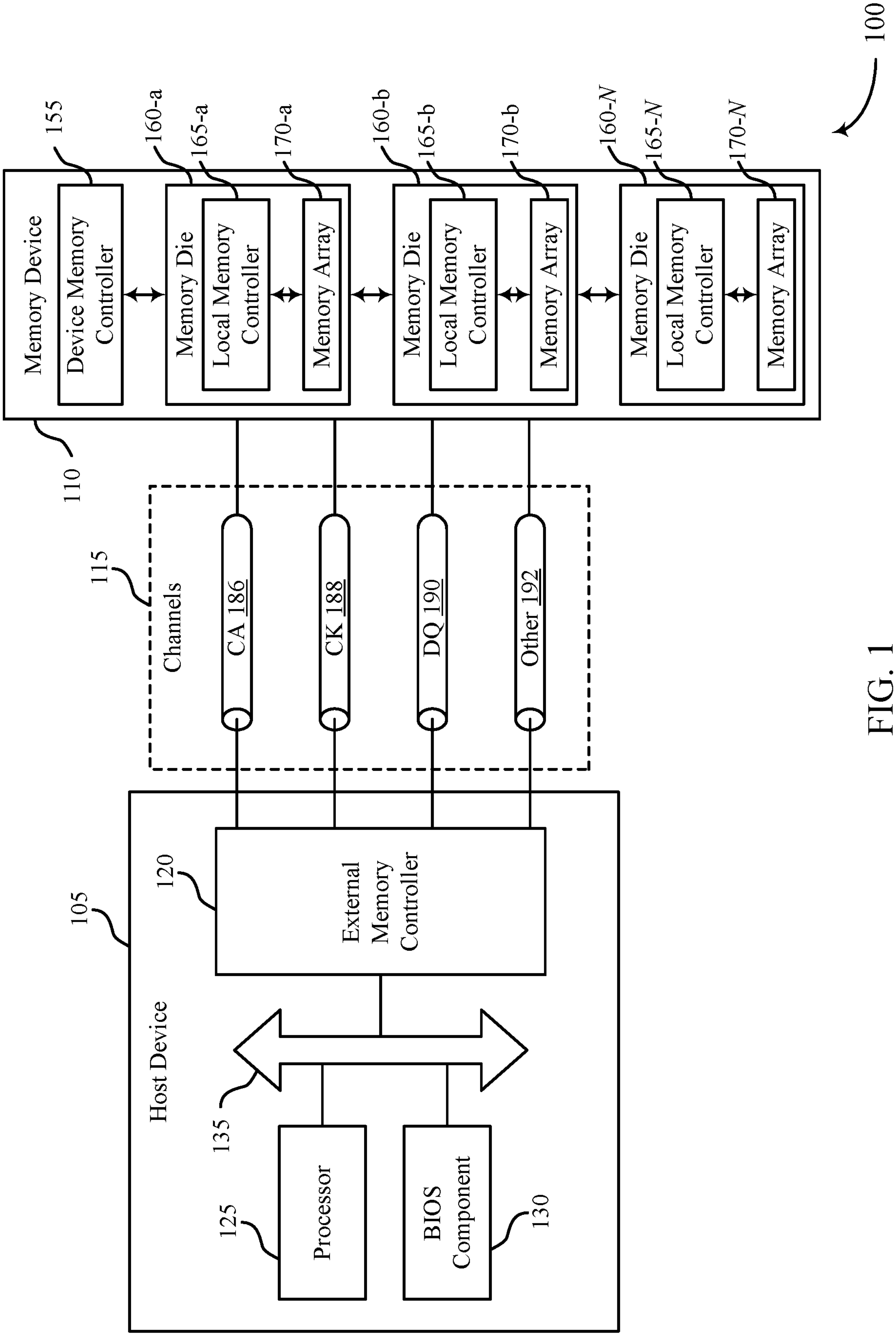
FIG. 1 illustrates an example of a system that supports staggered horizontal cell architecture for memory devices in accordance with examples as disclosed herein.

Memory devices may include one or more arrays of memory cells and supporting circuitry formed over a substrate for operating and accessing the memory cells. For example, a memory device may include one or more memory arrays that have multiple levels of memory cells, where a level may refer to a plane above and, in some cases, parallel to the substrate (e.g., in a horizontal direction). In some cases, a memory cell of a memory array may include an access line coupled with a selection component (e.g., a switching component, a cell selection component, one or more transistors) that is operable to couple a capacitor with a voltage source (e.g., a digit line) such that the logic state may be written or read. For example, a word line may extend through each layer of the substrate (e.g., in a vertical direction) to couple with a respective memory cell on each layer. Increasing the density of memory cells may support increased storage capacity of the memory array relative to its size, among other benefits. In some cases, however, as memory cell density increases, the space between word lines on a substrate layer (e.g., in a horizontal direction) may become relatively small, which may result in shorts (e.g., discharge) between adjacent word lines (e.g., vertical word lines in a 3-dimensional (3D) dynamic random access memory (DRAM) system), cross-talk between adjacent word lines, other adverse effects, or any combination thereof.

In accordance with the examples described herein, memory devices may implement a staggered architecture for one or more access lines (e.g., bit lines in a DRAM architecture such as a 3D DRAM architecture), which may result in increased spacing (e.g., increase horizontal spacing compared to other different architectures) between access lines (e.g., adjacent, neighboring) while maintaining a relatively high cell density. In some cases, a memory device with multiple layers (e.g., a device with vertical stacking of memory cells and access lines) may include one or more staircase structures, such that each step of the staircase structure may correspond to a layer of the device. For example, a first staircase structure may be formed on one edge of the device, and a second staircase structure may be formed on another edge (e.g., an opposite edge) of the device. Additionally, a pattern may be etched into the layers (e.g., a continuous pattern, a serpentine pattern) and may be filled with a dielectric material (e.g., an oxide material). In some examples, multiple access lines (e.g., bit lines) may be formed through the stack and extend through each layer.

The access lines may have a staggered orientation. For example, a first set of access lines may be formed from a first portion of the stack (e.g., located near a first edge of the stack), and a second set of access lines may be formed from a second portion of the stack (e.g., located near a second edge of the stack opposite of the first edge). By arranging the sets of access lines relative to (e.g., on) different portions of the stack (e.g., the access lines may alternate from originating at the first portion and the second portion), a distance between access lines (e.g., adjacent, neighboring) in a respective portion may be increased. Such a staggered configuration (e.g., staggered architecture) may result in a reduced likelihood of shorts, cross-talk between access lines, other adverse effects, or any combination thereof. In some examples, in line with the examples of the present disclosure, a staircase structure on the edge of a memory device may couple with multiple sets of access lines to form scalable repeat units (e.g., a 'tree'). For example, a first set of access lines may extend in a first direction, and a second set of access lines may extend in a second direction opposite the first direction. In such examples, multiple trees may be interlaced (e.g., in the staggered configuration), which may allow the memory device to maintain relatively high cell density while avoiding or mitigating adverse effects of access lines in relatively close proximity.

Figure 2:
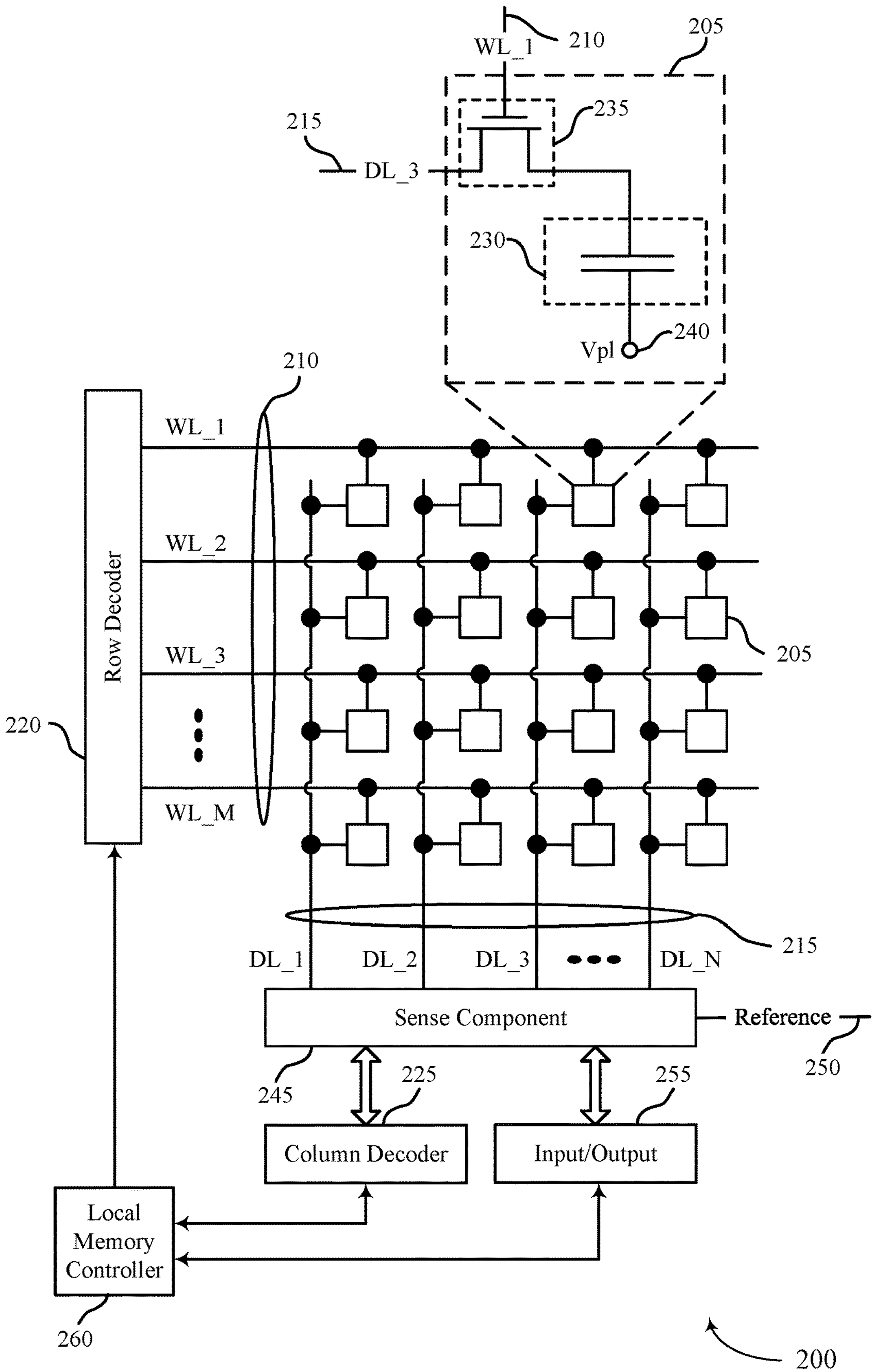
FIG. 2 illustrates an example of a memory architecture that supports staggered horizontal cell architecture for memory devices in accordance with examples as disclosed herein.

Features of the disclosure are initially described in the context of systems and devices with reference to FIGS. 1 and 2. Features of the disclosure are described in the context of layouts, schemes, and structures with reference to FIGS. 3 through 8. These and other features of the disclosure are further illustrated by and described in the context of a flowchart that relate to staggered horizontal cell architecture for memory devices with reference to FIG. 9.

FIG. 1 illustrates an example of a system 100 that supports staggered horizontal cell architecture for memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory device 100 may support a staggered architecture, including but not limited to a DRAM architecture, for one or more access lines, which may be examples of digit lines (e.g., bit lines), word lines, or both. For example, an increased density of memory cells 105 may result in a reduced physical distance between access lines, such as digit lines (e.g., bit lines). In some cases, the access lines being relatively closer together may result in shorts, cross-talk, or both. In accordance with techniques described herein, the access lines of the memory device 100 may be arranged in a staggered manner, which may increase the distance between adjacent access lines on a first portion of the device and adjacent access lines on a second portion (e.g., edge) of the device. By implementing such techniques, the memory device 100 may realize relatively high density of memory cells and access lines while mitigating cross-talk, word line to word line shorts, and the like, among other benefits.

FIG. 2 illustrates an example of a memory die 200 that supports staggered horizontal cell architecture for memory devices in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. In some examples of the present disclosure, a DRAM architecture may be implemented. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some cases, the various components of the memory die 200 may be placed in accordance with a staggered architecture, including but not limited to a DRAM architecture, that supports increased density of memory cells 205. For example, access lines (e.g., digit lines 215, word lines 210) may be staggered on each layer of the memory die 200. As an illustrative example, a first set of access lines may be placed opposite and offset from a second set of access lines on each layer of the memory die 200 (e.g., each access line on a layer may alternate from originating at a first portion of the device to originating at a second portion of the device). By implementing such techniques, the memory die 200 may realize relatively high density while mitigating cross-talk, word line to word line shorts, and the like, among other benefits.

Figure 3:
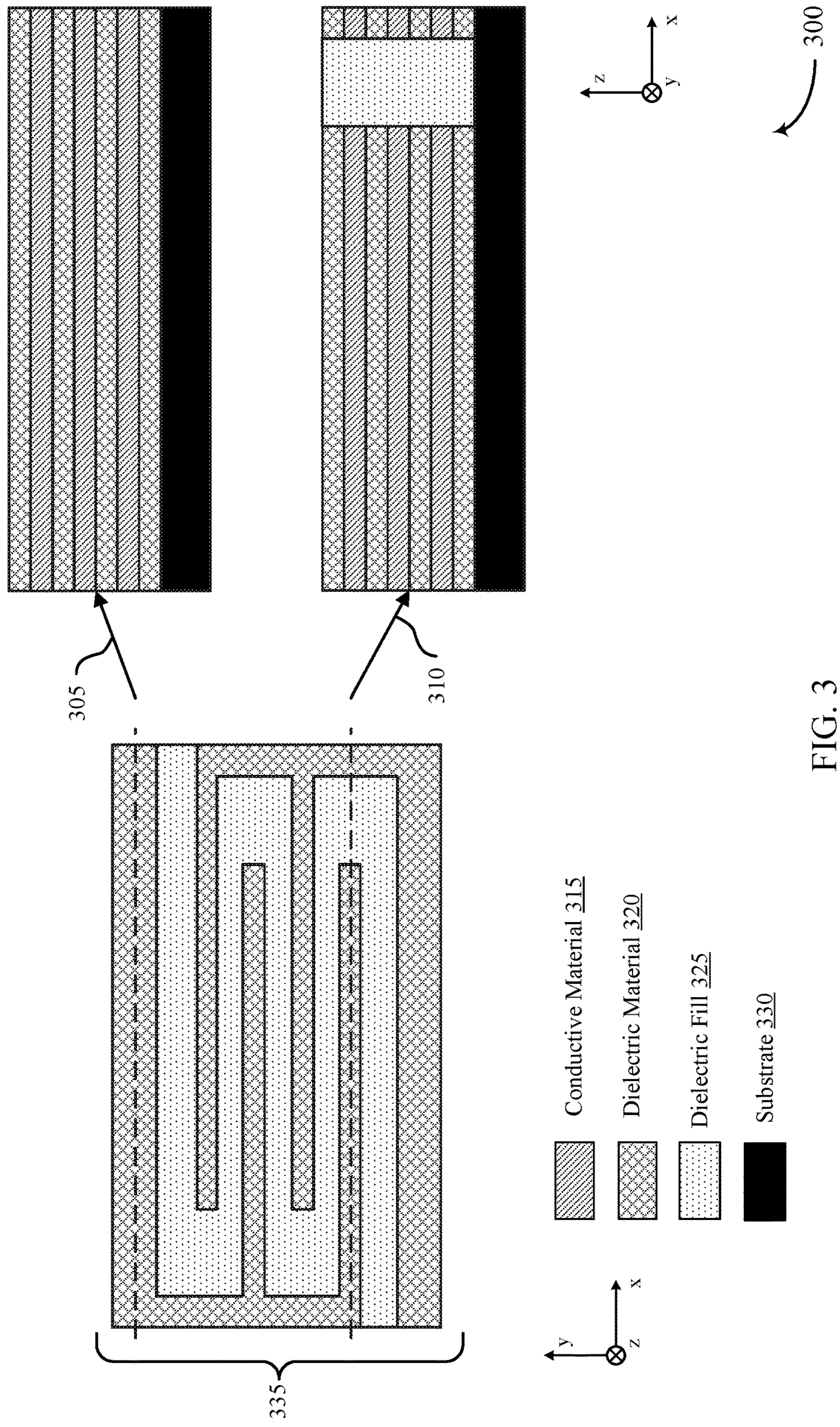
FIG. 3 illustrates an example of a layout that supports staggered horizontal cell architecture for memory devices in accordance with examples as disclosed herein.

FIG. 3 illustrates an example of a layout 300 that supports staggered horizontal cell architecture for memory devices in accordance with examples as disclosed herein. The layout 300 illustrates an example of a first set of manufacturing operations for a memory device which supports a staggered architecture as described herein (e.g., a staggered arrangement of memory cells, which may be referred to as or examples of capacitors, access devices, and the like). In some examples, the staggered architecture may include, but is not limited to, a DRAM architecture such as a 3D DRAM architecture. In some cases, the layout 300 may include one or more layers of conductive material 315, one or more layers of dielectric material 320, a dielectric fill 325 (e.g., a same or different material as the dielectric material 320), a substrate 330, or any combination thereof. Although the various stacks of materials (e.g., layers) and other components are illustrated as having 6 layers over a substrate, any quantity of layers may be used, any type of material may be used, the stack of layers may have different patterns or alternating materials, or any combination thereof, among other examples. For illustrative clarity, the layout 300 may include a top-down view 335 of a memory device associated with the first set of manufacturing operations, a first cross section view 305 of the memory device, and a second cross section view 310 of the memory device.

In some examples, the first set of manufacturing operations may include forming various structures and materials over (e.g., on, in contact with, above) a substrate 330. The substrate 330 may be a semiconductor wafer or other substrate over which a stack of layers is formed (e.g., deposited, etched). For example, the stack of layers (i.e., stack of materials) may include alternating layers of a dielectric material 320 (e.g., an oxide material or another example of a dielectric material, a dielectric layer) and a conductive material 315 (e.g., a poly silicon material, a conductive layer). As an illustrative example, the first set of manufacturing operations may include forming (e.g., depositing) a layer of the dielectric material 320 over the substrate 330, forming (e.g., depositing) a layer of the conductive material 315 over the layer of dielectric material 320, forming (e.g., depositing) a second layer of the dielectric material 320 over the layer of the conductive material 315, and so on. In some examples, other operations may be performed between any of the operations described herein, or some operations may be removed. As an example, material may be removed (e.g., etched) in between forming (e.g., depositing) each layer of the dielectric material 320 and the conductive material 315, operations to planarize the layers may be performed, and the like.

In some examples, a portion of the layers of the dielectric material 320 may be an example of a sacrificial material or layer. A sacrificial layer may be a layer of material that provides structure and spacing during the manufacturing process but may be removed (e.g., etched) at various points of the process. Stated alternatively, a sacrificial layer or material may be absent from the final product of the manufacturing operations described herein.

The first set of manufacturing operations may include forming a pattern of dielectric fill 325 (e.g., an oxide material) through the stack of layers. For example, the forming such a pattern may include removing (e.g., etching) portions of the stack of layers, such that voids are formed in the pattern. A dielectric fill 325 may be formed (e.g., deposited) into the void to form the pattern of the dielectric fill 325. In some examples, the pattern may be an example of a continuous pattern (e.g., a serpentine pattern) as described herein. For example, the pattern may be a portion of the dielectric fill 325 formed (e.g., deposited) in the stack of layers without any separation via other materials or voids between the section of formed (e.g., deposited) dielectric fill 325, the pattern may outline the access lines (e.g., nano wires) of polysilicon that are staggered relative to each other, and the like. Additionally or alternatively, the pattern may be examples of other pattern types associated with a staggered architecture, such as two half-serpentine patterns, a pattern having a horizontal line with staggered perpendicular lines to form a staggered array, and the like, among other examples of patterns. In some examples, the pattern may not be continuous.

In some examples, such a pattern may support the formation and architecture of staggered memory elements (e.g., memory cells, capacitors, access devices, access lines such as bit lines, capacitor plates, and the like) as described herein. For example, as shown in the top-down view 335, the portions of the stack of materials removed by the pattern may be formed into access lines (e.g., bit lines, although it is to be understood such access line formation techniques may additionally or alternatively be applied to word lines) of a set of levels. For instance, the layers of conductive material 315 may be poly-silicon material that will be formed into at least a portion of an access device (e.g., each layer of the conductive material 315 may be formed into an access line in a vertical layer of the memory device). In some examples, the layers of conductive material 315 may be referred to as wires (e.g., poly silicon nano wires), access lines (e.g., bit lines, word lines), or both.

Such operations and patterns may result in the layers of conductive material 315 that are coupled to a first portion of the memory device (e.g., originating from a first edge) being staggered relative to the layers coupled to an opposite, second portion of the memory device (e.g., originating from a second edge). As an illustrative example, the conductive material 315 shown in the second cross section view 310 may show three access lines (e.g., bit lines in a DRAM system such as a 3D DRAM system) coupled to the first portion and separated from three access lines coupled to the second portion by the dielectric fill 325. By having a continuous pattern or a similar pattern, a distance between capacitors to be formed on the access lines of a respective portion of the memory device may be increased due to the staggered arrangement, as described herein with respect to FIG. 5. In some examples, the structure of the stack of layers formed as a result of forming the continuous pattern may be referred to as fin structures or a fin architecture (e.g., a fin as described herein with reference to FIG. 7).

Figure 4:
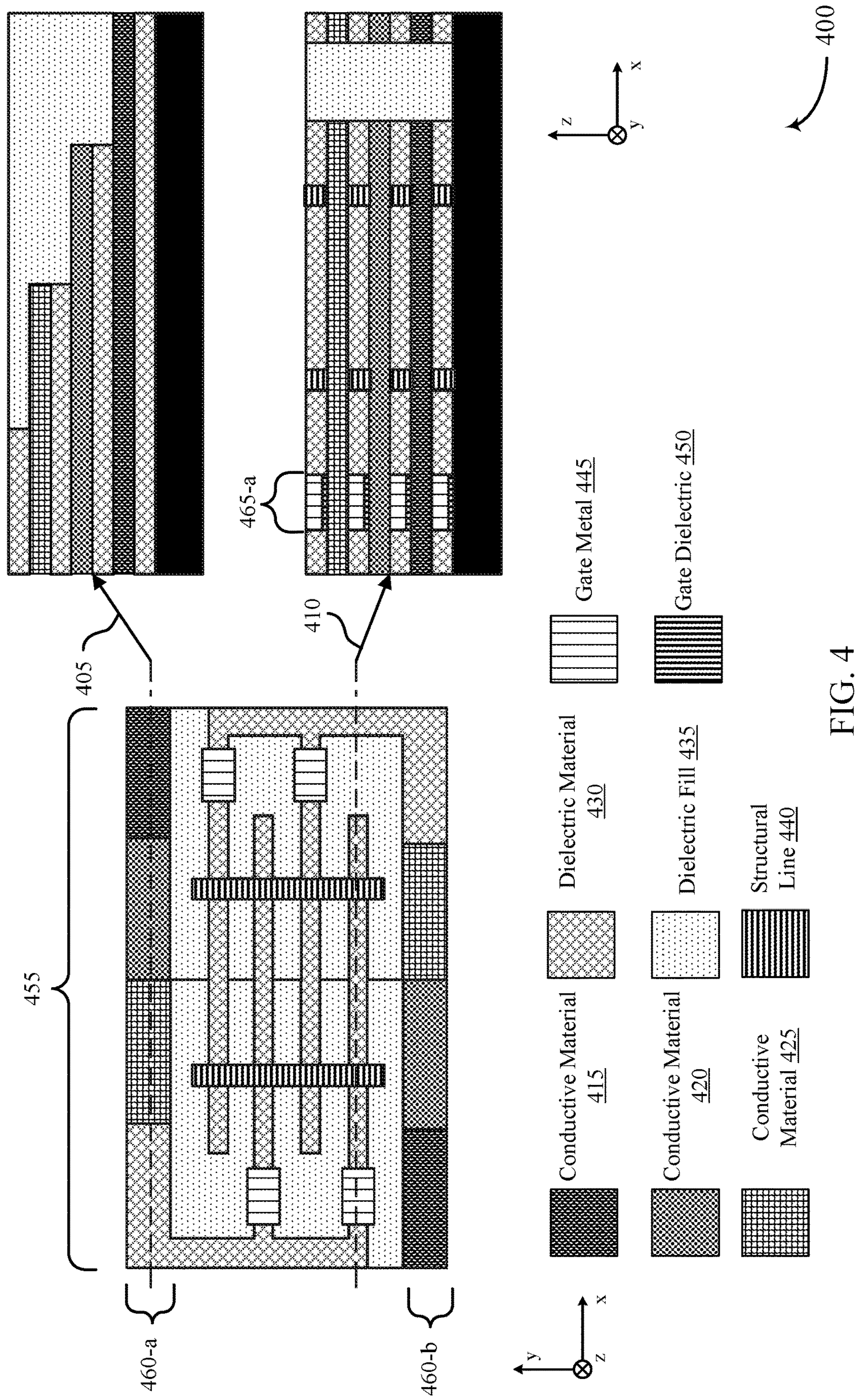
FIG. 4 illustrates an example of a layout that supports staggered horizontal cell architecture for memory devices in accordance with examples as disclosed herein.

FIG. 4 illustrates an example of a layout 400 that supports staggered horizontal cell architecture for memory devices in accordance with examples as disclosed herein. In some examples, the staggered architecture may include, but is not limited to, a DRAM architecture such as a 3D DRAM architecture. The layout 400 illustrates an example of a second set of manufacturing operations for a memory device which supports a staggered architecture as described herein (e.g., a staggered arrangement of memory cells, which may be referred to as or examples of capacitors, access devices, and the like). In some cases, the layout 400 may include or be included by aspects of the layout 300. For example, the second set of manufacturing operations may include or be performed subsequent to the first set of manufacturing operations. Although the various stacks of materials (e.g., layers) and other components are illustrated as having various layers over a substrate, any quantity of layers may be used, any type of material may be used, the stack of layers may have different patterns or alternating materials, or any combination thereof, among other examples. For illustrative clarity, the layout 400 may include a top-down view 455 of a memory device associated with the second set of manufacturing operations, a first cross section view 405 of the memory device, and a second cross section view 410 of the memory device.

The layout 400 may include one or more layers of conductive material 415, conductive material 420, conductive material 425, or any combination thereof, which may be examples of conductive material 315 as described with reference to FIG. 3 (e.g., poly-silicon material). Additionally or alternatively, the layout 400 may include dielectric material 430, dielectric fill 435, one or more structural lines 440, gate metal 445, gate dielectric 450, or any combination thereof. In some examples, the dielectric materials described in FIG. 4 may be examples of the dielectric materials described herein with reference to FIGS. 1-3 (e.g., an oxide material).

The second set of manufacturing operations may include forming one or more staircase structures 460. A staircase structure 460 may support vertical layers of memory cells. For example, a staircase structure 460 may have a set of levels, and each level may correspond to a respective set of memory cells (e.g., capacitors) at a vertical distance from the substrate associated with that level. In the illustrative example of the layout 400, two staircase structures may be formed at two portions (e.g., edges, areas) of the memory device. The staircase structure 460-*a* may have 3 levels and the staircase structure 460-*b* may have 3 levels, although any quantity of levels or staircase structures 460 may be used. Each level of the staircase structure 460-*a* may be shown with a different conductive material for illustrative clarity, though the various conductive materials described herein may be a same conductive material (e.g., the conductive material 315 as described with reference to FIG. 3). For example, the staircase structure 460-*a* may include a first level having an access line represented by a layer of the conductive material 415, a second level having an access line represented by a layer of the conductive material 420, and a third level having an access line represented by a layer of the conductive material 425. In some examples, the access lines may be examples of bit lines in a DRAM system (e.g., each of the bit lines may couple to at least one vertical word line). Each level may be associated with a different vertical height (e.g., in the Z direction) of the memory device. In some examples, the staircase structure 460-*a* may be inverted relative to the staircase structure 460-*b*. For example, the first cross section view 405 may illustrate a highest vertical level occurring on a first portion of the memory device (e.g., a left edge) and a lowest vertical level occurring on a second portion of the memory device (e.g., a right edge). The staircase structure 460-*b* may have an opposite structure, where the highest vertical level of the staircase structure 460-*b* is formed on the second portion of the memory device and the lowest vertical level is formed (e.g., occurs) on the first portion of the memory device. The staircase structures may be formed on opposite portions of the memory device (e.g., a third portion, such as the top of the top-down view 455, and a fourth portion, such as a bottom of the top-down view 455, respectively). In some examples, dielectric fill 435 may be formed (e.g., deposited) over the staircase structures 460.

The second set of manufacturing operations may include forming one or more structural lines 440. The structural lines 440 may be a material to provide structure and support to one or more components of the memory device (e.g., the access lines), for example, if one or more portions of sacrificial material are removed (e.g., the dielectric fill 435 may be removed in the serpentine pattern at a stage of manufacturing). Stated alternatively, the structural lines 440 may hold up and structurally support the capacitors (formed on the conductive material lines) once oxide fill is etched away from around the capacitors as described herein with reference to FIG. 6. The structural lines 440 may be an example of a nitride material formed (e.g., deposited) in voids that are etched from the dielectric material 430 in the stack of layers. As an illustrative example, layers of dielectric material 430 may be etched away selectively between the various layers of conductive material 415, 420, and 425, and the structural lines 440 may be formed (e.g., deposited) between the layers of conductive material 415, 420, and 425, as shown in the second cross section view 410, though any quantity or locational placement of the structural lines 440 may be used.

The second set of manufacturing operations may include forming one or more memory elements (e.g., capacitors 465). For example, a first capacitor 465-*a* may be formed on the top layer of the second cross section view 410 (e.g., the capacitor 465-*a* may include gate metal 445 over gate dielectric). Additionally or alternatively, vertical capacitors 465 may be formed on each level (e.g., three capacitors 465 formed below the first capacitor 465-*a*, though any quantity or placement of capacitors 465 may be used), capacitors 465 may be formed in the horizontal direction (e.g., the other three access lines extending into the dielectric fill 435 in the top down view 455 may each have a capacitor 465), or a combination thereof. In the illustrative example of layout 400, four capacitors 465 may be formed on a respective access line as shown in the top down view 455, and each capacitor may have a set of capacitors in a vertical direction below (e.g., as shown in the second cross section view 410), although any quantity or configuration of capacitors 465 may be used.

In some examples, forming a memory element may include opening a hole in the dielectric material 430 (e.g., oxide around the poly silicon layers), for example, using a photo and etch step to remove the dielectric material 430. Gate dielectric 450 may be formed (e.g., deposited) in a first portion of the holes to form a base of the capacitor (i.e., memory element). Gate metal 445 may be formed (e.g., deposited) over the gate dielectric 450 in a second portion (e.g., a remaining portion) of the holes to form the memory element, which may be referred to as an access device situated on a respective access line (e.g., a capacitor situated on a bit line in a DRAM system such as a 3D DRAM system). Stated alternatively, the second set of manufacturing operations may include selectively removing oxide from around wires (e.g., lines of conductive material such as poly-silicon in each level of the staircase structures 460) and then filling the empty space the with the gate materials. In some examples, such operations may form the vertical word line device with gate dielectric and gate metal, which may be an example of a double gate or a gate all around (GAA).

Although described as being formed with various components and by various manufacturing operations, it is to be understood that any of the layouts described herein may include additional or alternative components formed by additional or alternative manufacturing operations, such as interconnection or routing circuitry, control circuitry, or other structures and materials, which may include various conductor, semiconductor, or dielectric materials between the structures and materials and the substrate. Further, although described as conductive materials 415, 420, 425, such materials may be examples of other terminology (e.g., semi-conductive materials).

In some examples, by staggering the capacitors 465 relative to each other as shown in the layout 400, a horizontal distance (e.g., a distance in the y direction of the top-down view 455) between capacitors 465 on a same portion (e.g., edge, area) of the memory device may be increased, which may result in reduced likelihood for access line shorts or crosstalk between the devices as described with reference to FIG. 5. In the example of the layout 400, devices on a first portion of the memory device (e.g., the left side of the top-down view 455) may be spaced further from each other due to staggering each capacitor 465 to have another capacitor 465 on the second portion (e.g., the right side of the top-down view 455) with an access line extending towards the first portion and between the two capacitors on the first portion.

Figure 5:
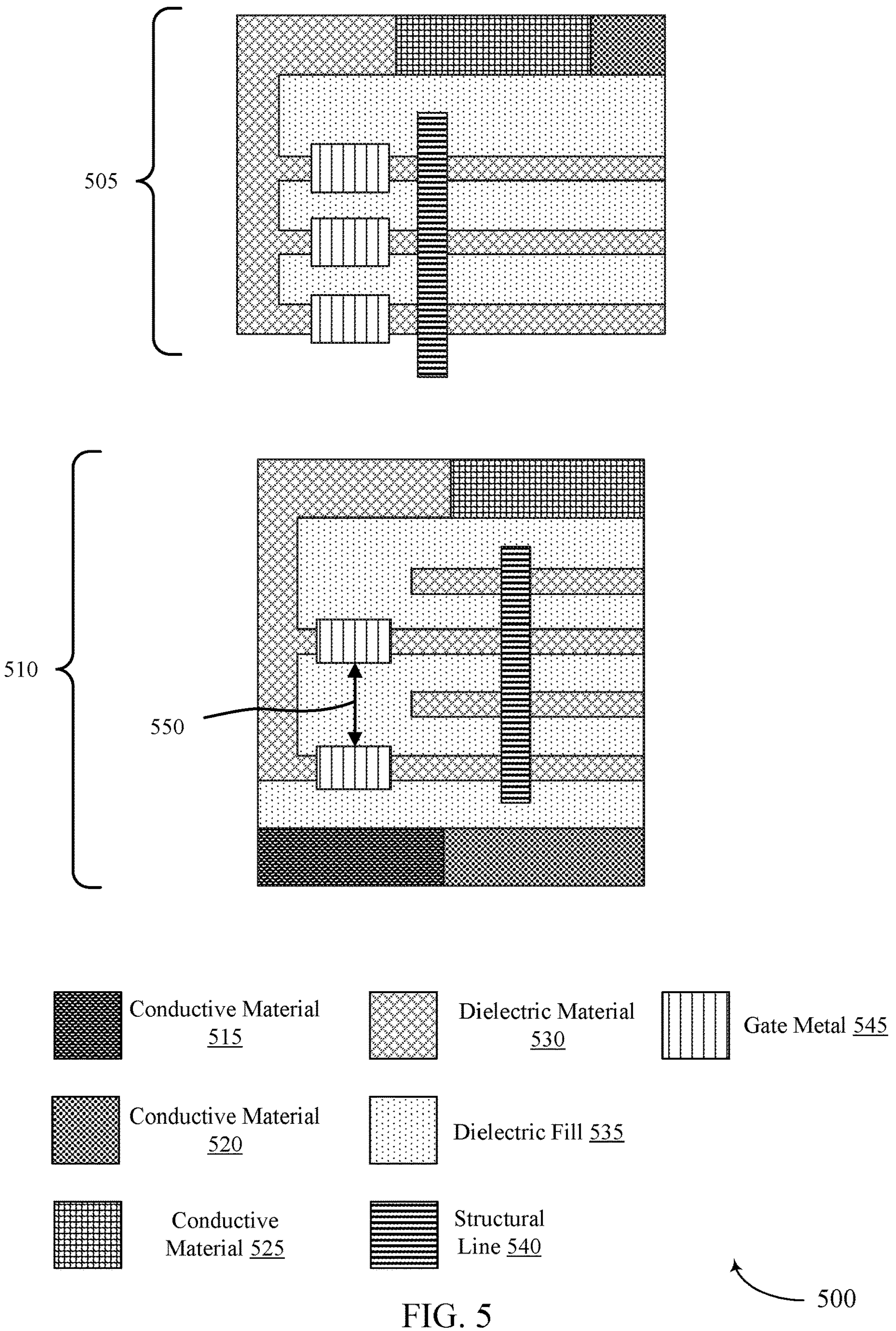
FIG. 5 illustrates an example of a scheme that supports staggered horizontal cell architecture for memory devices in accordance with examples as disclosed herein.

FIG. 5 illustrates an example of a scheme 500 that supports staggered horizontal cell architecture for memory devices in accordance with examples as disclosed herein. In some examples, the staggered architecture may include, but is not limited to, a DRAM architecture such as a 3D DRAM architecture. The scheme 500 may include a first layout 505 and a second layout 510. In some cases, the scheme 500 may include conductive materials 515, 520, and 525, dielectric material 530, dielectric fill 535, structural lines 540, gate metal 545, or any combination thereof, which may be examples of the corresponding elements as described with reference to FIGS. 1-4. In some examples, the first layout 505 and the second layout 510 may illustrate examples of a portion of a top-down view of different layouts for capacitors formed by the gate metal on respective access lines (e.g., bit lines) for a level of a vertical memory device.

The first layout 505 may illustrate an arrangement of access lines with capacitors (e.g., illustrated by the positions of gate metal 545) that does not use a staggered architecture. For example, the first layout 505 may illustrate an example of three access lines having three respective capacitors on a level of a memory device. The capacitors may be on a same portion of the memory device, and adjacent access lines and capacitors may have a relatively short horizontal distance to each other compared to the second layout 510. In some examples, such a configuration may result in shorting between access lines, cross-talk between access lines, or both.

Accordingly, the second layout 510 may illustrate a portion of a device formed using the techniques for a staggered architecture as described herein. For example, the second layout 510 may include a serpentine pattern of the dielectric fill 535 as described herein, resulting in access lines formed within the pattern having a staggered configuration. In such a staggered configuration, adjacent access lines and respective capacitors on a same portion of the memory device may be separated by a relatively larger spacing 550. For example, the second layout 510 may show four access lines, two located on the first portion of the memory device (e.g., a first edge of the memory device) and two located on the second portion (not shown), such as a second edge (e.g., side) of the memory device. For instance, a capacitor on the access line between the two shown capacitors may originate or otherwise be located on another portion of the device. Thus, the two shown capacitors may have a spacing 550 that is larger than the spacing between adjacent capacitors shown in the first layout 505, which may reduce the likelihood of cross-talk and shorting while maintaining a relatively high memory cell density in the memory device, among other benefits. Stated alternatively, the architecture of the second layout 510 may reduce a risk of word line to word line shorts by increasing the distance between adjacent fins and access devices on a same bit line.

Figure 6:
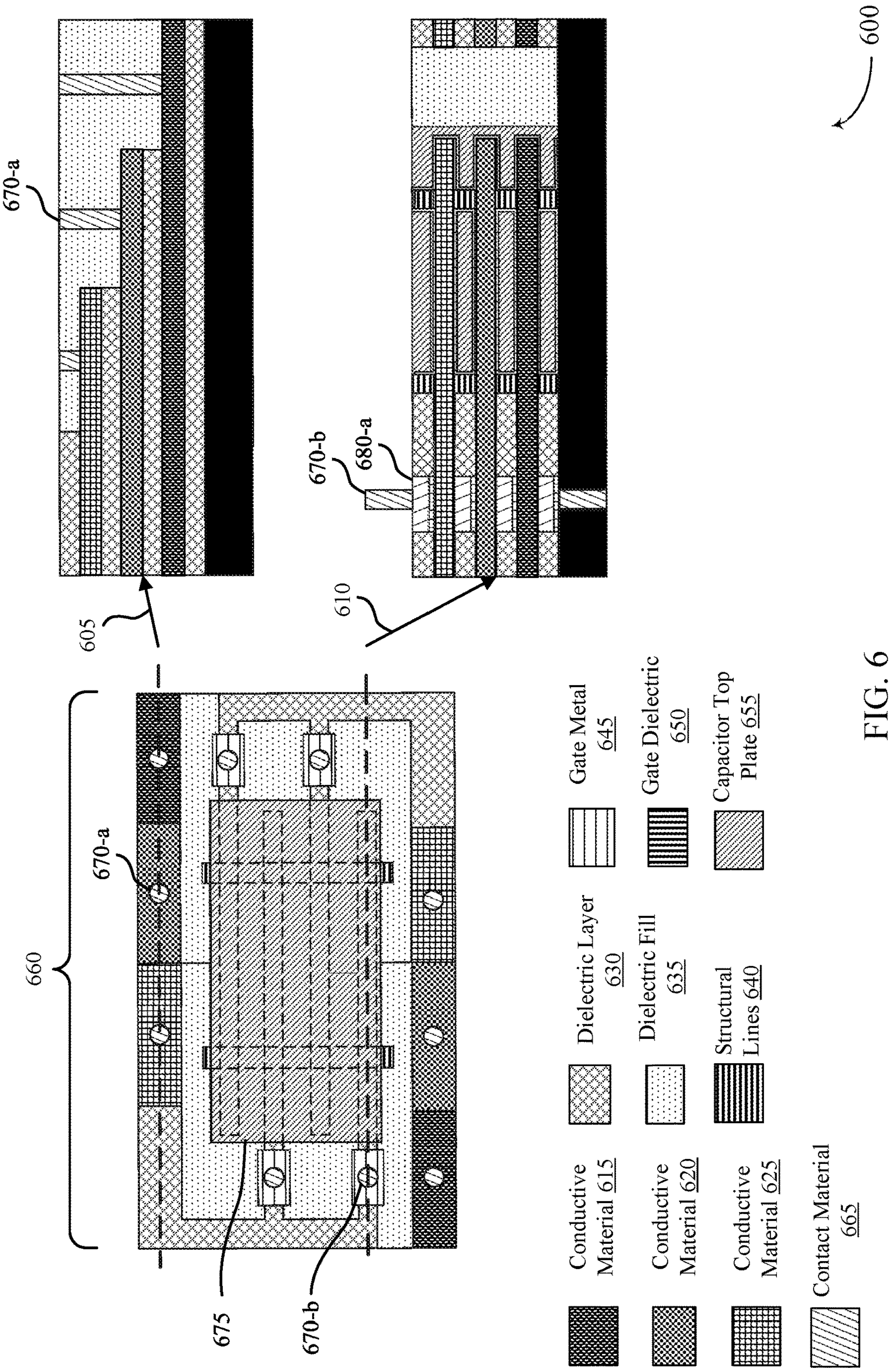
FIG. 6 illustrates an example of a layout that supports staggered horizontal cell architecture for memory devices in accordance with examples as disclosed herein.

FIG. 6 illustrates an example of a layout 600 that supports staggered horizontal cell architecture for memory devices in accordance with examples as disclosed herein. In some examples, the staggered architecture may include, but is not limited to, a DRAM architecture such as a 3D DRAM architecture. The layout 600 illustrates an example of a third set of manufacturing operations for a memory device which supports a staggered architecture as described herein (e.g., a staggered arrangement of memory cells, which may be referred to as or examples of capacitors, access devices, and the like). In some cases, the layout 600 may include or be included by aspects of the layouts 300 and 400. For example, the third set of manufacturing operations may include or be performed subsequent to the first set of manufacturing operations, the second set of manufacturing operations, or both. Although the various stacks of materials (e.g., layers) and other components are illustrated as having various layers over a substrate, any quantity of layers may be used, any type of material may be used, the stack of layers may have different patterns or alternating materials, or any combination thereof, among other examples. For illustrative clarity, the layout 600 may include a top-down view 660 of a memory device associated with the second set of manufacturing operations, a first cross section view 605 of the memory device, and a second cross section view 610 of the memory device.

The layout 600 may include one or more layers of conductive material 615, conductive material 620, conductive material 625, or any combination thereof, which may be examples of conductive materials 415, 420, and 425 as described with reference to FIG. 4 (e.g., poly-silicon material). Additionally or alternatively, the layout 600 may include dielectric material 630, dielectric fill 635, one or more structural lines 640, gate metal 645, gate dielectric 650, capacitor top plates 655, contact material 665, or any combination thereof, which may be examples of corresponding components as described herein with reference to FIGS. 1-4 (e.g., an oxide material).

In some examples, the third set of manufacturing operations may be performed on the layout 400. For example, the third set of manufacturing operations may include removing (e.g., etching) portions of the dielectric fill 635. Stated alternatively, oxide may be removed from capacitor studs in the area 675 of the memory device (e.g., the substrate may be exposed in the top-down view 660 based on removing the dielectric fill 635). In some examples, the various layers of conductive material may be metallized. For example, a metallization operation may be performed on the exposed access lines (e.g., layers of conductive material 615, 620, and 625). Such an operation may aid in creation of a metal-insulator-metal (MIM) capacitor at each layer of the memory device. In some other examples, the layers of conductive material may not be metallized. In some cases, the exposed conductive layers may serve as capacitor studs, which may be supported by the one or more structural lines 640 (e.g., nitride lines after removing dielectric fill 635).

The third set of manufacturing operations may include forming (e.g., depositing) a capacitor top plate 655 on each of the access lines, as shown for example in the second cross section view 610. That is, the capacitor top plate 655 may be formed (e.g., deposited) over the access lines that were exposed (e.g., metallized cap studs) after forming (e.g., depositing) a capacitor dielectric. Stated alternatively, the capacitor top plate 655 may be formed (e.g., deposited) over a layer of capacitor dielectric located between lines of conductive material and the capacitor top plate 655. In some examples, the capacitor top plate 655 may be an example of a metal material, a poly silicon material, or any other conductive material. In some examples, forming (e.g., depositing, etching, etc.) the capacitor top plate 655 may finish the formation of capacitors with dielectric material. For example, the capacitor 680-*a* may be an example of a finished capacitor 680 having a capacitor top plate 655, a capacitor bottom plate (e.g., the conductive material 625), a gate metal portion 645, gate dielectric 650, and the like.

The third set of manufacturing operations may include forming contacts 670 from contact material 665. For example, contacts 670 may be formed to connect various components (e.g., gates, access lines) of the memory device to other circuitry, such as interconnect circuitry, control circuitry, and the like. In some examples, forming the contacts may include removing dielectric material (e.g., dielectric fill 635) to form a hole, and forming (e.g., depositing) the contact material 665 in the holes. In some examples, the contacts 670 may be located on one or more sides (e.g., portions) of the device. As an illustrative example, the contact 670-*b* may connect the memory device to a top side of the second cross section view 610. Additionally or alternatively, the contact 670-*b* may be located at a bottom side of the memory device (e.g., the contact 670-*b* may extend through the substrate to connect the components). In some examples, forming the contacts 670 may include a photo etch through a film such as a dielectric material above the array (not shown) and filling the resulting hole with contact material 665.

In some examples, a capacitor dielectric and capacitor top plate 655 may be formed (e.g., deposited) around the capacitor studs (e.g., the portions of the access lines in the area 675), for example, to form MIM capacitors. For example, the capacitor dielectric may be formed (e.g., deposited) to surround the capacitor studs at each layer, and may support a relatively high capacitance (e.g., have a large dielectric constant, K). The capacitor top plate 655 may then be formed (e.g., deposited) into the remaining space where the dielectric was removed.

Figure 7:
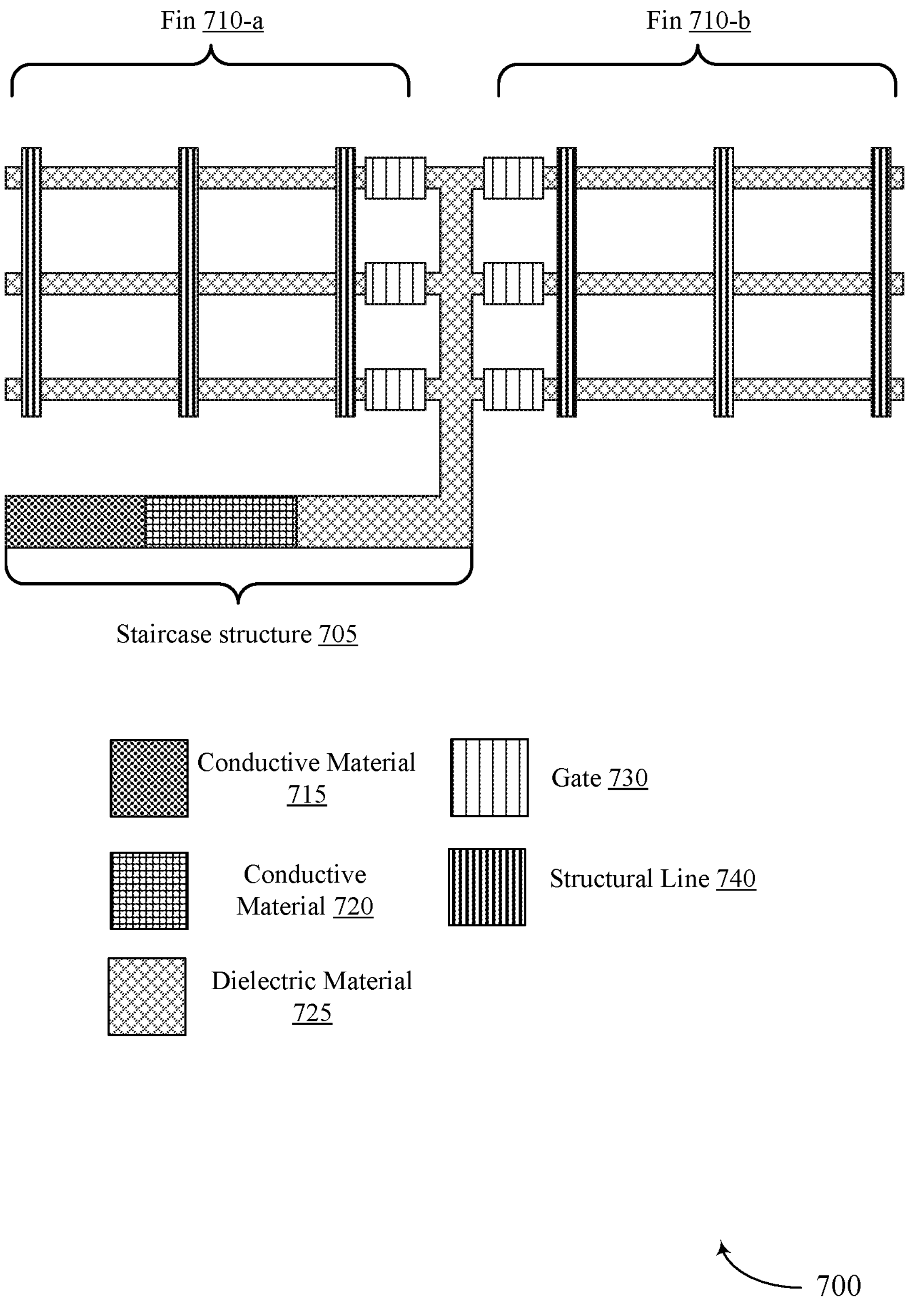
FIG. 7 illustrates an example of a repeatable structure that supports staggered horizontal cell architecture for memory devices in accordance with examples as disclosed herein.

FIG. 7 illustrates an example of a repeatable structure 700 that supports staggered horizontal cell architecture for memory devices in accordance with examples as disclosed herein. In some examples, the staggered architecture may include, but is not limited to, a DRAM architecture such as a 3D DRAM architecture. In some cases, the repeatable structure may be denoted as a "tree," and may include a staircase structure 705 and a quantity of fins 710, which may be examples of staircase structures and fins as described herein. The repeatable structure 700 may implement or be implemented by aspects of the layouts 300, 400, and 600. For example, the repeatable structure 700 may include conductive materials 715 and 720, dielectric material 725, gates 730, contacts 735, and structural lines 740, which may be examples of the corresponding components described in FIGS. 1-6. Generally, the repeatable structure 700 may be a result of one or more of the manufacturing operations described herein. For example, the layout 600 may include or be an example of a fin 710-*a* of a first repeatable structure 700 and another fin 710 of a second repeatable structure (not shown).

In the example of the repeatable structure 700, the staircase structure 705 may be formed and coupled to the fins 710-*a* and 710-*b*. The fins 710 may have a set of vertical levels (e.g., three levels or any quantity of levels). For example, while the fin 710-*a* is shown with three capacitors (i.e., access devices, memory cells), the fin 710-*a* also include three levels and thus 9 total capacitors. For instance, the first set of three capacitors may be associated with a first level of the staircase structure 705, a second set of three capacitors below the first three capacitors may be associated with a second level (e.g., the conductive material 720), a third set of three capacitors may be below the second set of three capacitors and may be associated with a third level (e.g., the conductive material 715), and so on, although any quantity of levels, capacitors, and arrangements may be used.

The fin 710-*a* may extend in a first direction and the fin 710-*b* may extend in a second direction opposite the first direction. To obtain a staggered orientation as described herein, the repeatable structure 700 may be repeated in a staggered manner. For example, a fin of another repeatable structure may have a fin with access lines extending in the second direction such that a space between the access lines of the other fin and the access lines of the fin 710-*a* is a continuous (e.g., serpentine) pattern as described herein. Thus, the fins 710 of adjacent repeatable structures 700 may be offset by a horizontal distance such that the access devices (e.g., capacitors) of the fin 710-*a* are on a first portion of the memory device (e.g., a first area) and staggered relative to access lines of another fin 710 of another structure on a second portion of the memory device (e.g., a second area). Stated alternatively, interlacing multiple trees may support efficient packing of repeatable structures 700 (e.g., repeatable units) while mitigating the likelihood of shorts and crosstalk between adjacent access lines. Such a staggered configuration may be repeatable for any quantity of repeatable structures 700. For example, a manufacturing process may be scaled by fabricating back-to-back fins 710 on a single staircase structure 705.

Additionally or alternatively, the interlacing trees may support inverted staircase structures 705. For example, a first tree may have the staircase structure on a first portion (e.g., on the bottom of the view of FIG. 7) while adjacent trees may have their respective staircase structures 705 on an opposite side (e.g., on the top of the view of FIG. 7). Such an orientation may provide for a larger contact "landing pad," improving the scalability of the device and supporting a higher quantity of memory cells in the trees. For example, by having alternating staircase structures 705 on opposite sides, an amount of space for the conductive material 715 and 720 may be increased compared to having the staircase structures 705 all on the same side, which may improve reliability of forming (e.g., depositing) contacts as described herein during one or more manufacturing operations.

In some examples, end caps (e.g., cap structures) may be formed to finalize an array. For example, after forming a quantity of trees in a staggered configuration, a first end cap may be placed at the end of the array and a second end cap may be places at the other end of the array, which may complete the array. The end cap may be an example of the tree shown in FIG. 7, but with a single fin 710 instead of two fins 710.

Although shown with certain quantities and arrangements of components, it is to be understood that any quantity or type of component may be used. For example, any quantity of levels, repeatable structures 700, access devices, and the like may be used. Additionally or alternatively, repeatable structures 700 (e.g., repeatable units) may be arranged above and below each other in any direction (e.g., the repeatable structure 700 may have an adjacent tree in any horizontal direction, such as below, above, left, and right). In some examples, a CMOS may be placed under the array. In some examples, the staircase structure 705 may be an example of the structure 800 as described herein with reference to FIG. 8.

Figure 8:
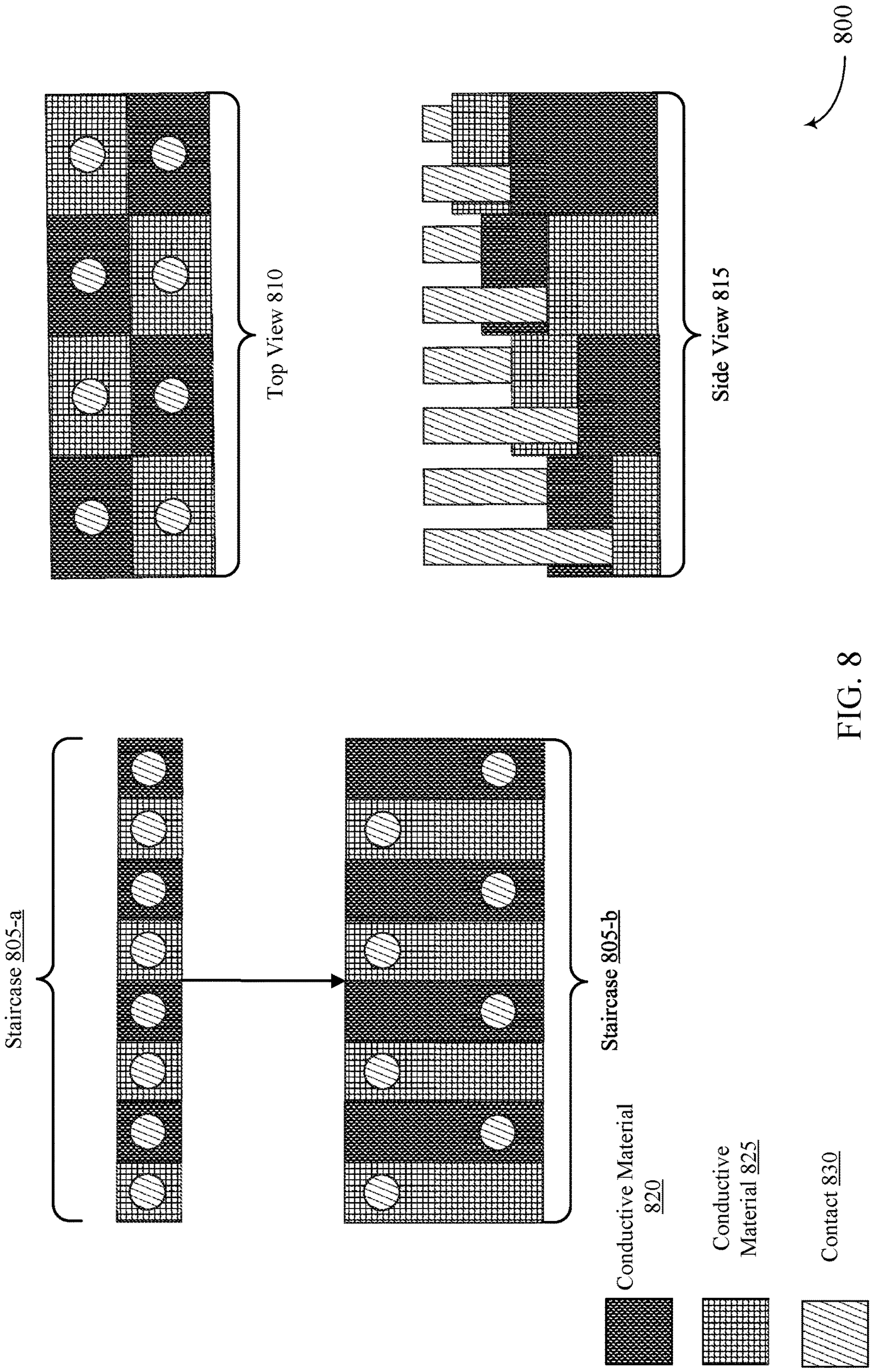
FIG. 8 illustrates an example of a structure that supports staggered horizontal cell architecture for memory devices in accordance with examples as disclosed herein.

FIG. 8 illustrates an example of a structure 800 that supports staggered horizontal cell architecture for memory devices in accordance with examples as disclosed herein. In some examples, the staggered architecture may include, but is not limited to, a DRAM architecture such as a 3D DRAM architecture. The structure 800 may implement or be implemented by aspects of FIGS. 1-7. For example, the structure 800 may include conductive material 820, conductivity material 825, and contacts 830, which may be examples of the corresponding components described herein with reference to FIGS. 1-7.

The staircase 805-*a* may be an example of a staircase with a single row of contacts 830. The staircase 805-*b* may be an example of a staircase with a staggered row orientation of contacts 830. The top view 810 and the side view 815 may be illustrative examples of the staircase 805-*b*.

As illustrated in the structure 800, the staircase 805-*b* may support a same quantity of contacts as the staircase 805-*a* while also providing a larger landing area for forming the contacts 830, resulting in a relatively more reliable fabrication process of the memory device. Stated alternatively, the staircase structure 805-*b* may lengthen the staircase to increase the contact landing area, and the staircase fin may be made wider. Such techniques may promote structural stability and may prevent or mitigate shorts between adjacent contacts 830. Additionally or alternatively, the staircase structure 805-*b* may be offset, which may further increase the landing pad area. For example, the side view 815 shows how the two rows have levels offset relative to their respective column. In some examples, the staircase structures 805 may be implemented in the staircase structures described herein.

Figure 9:
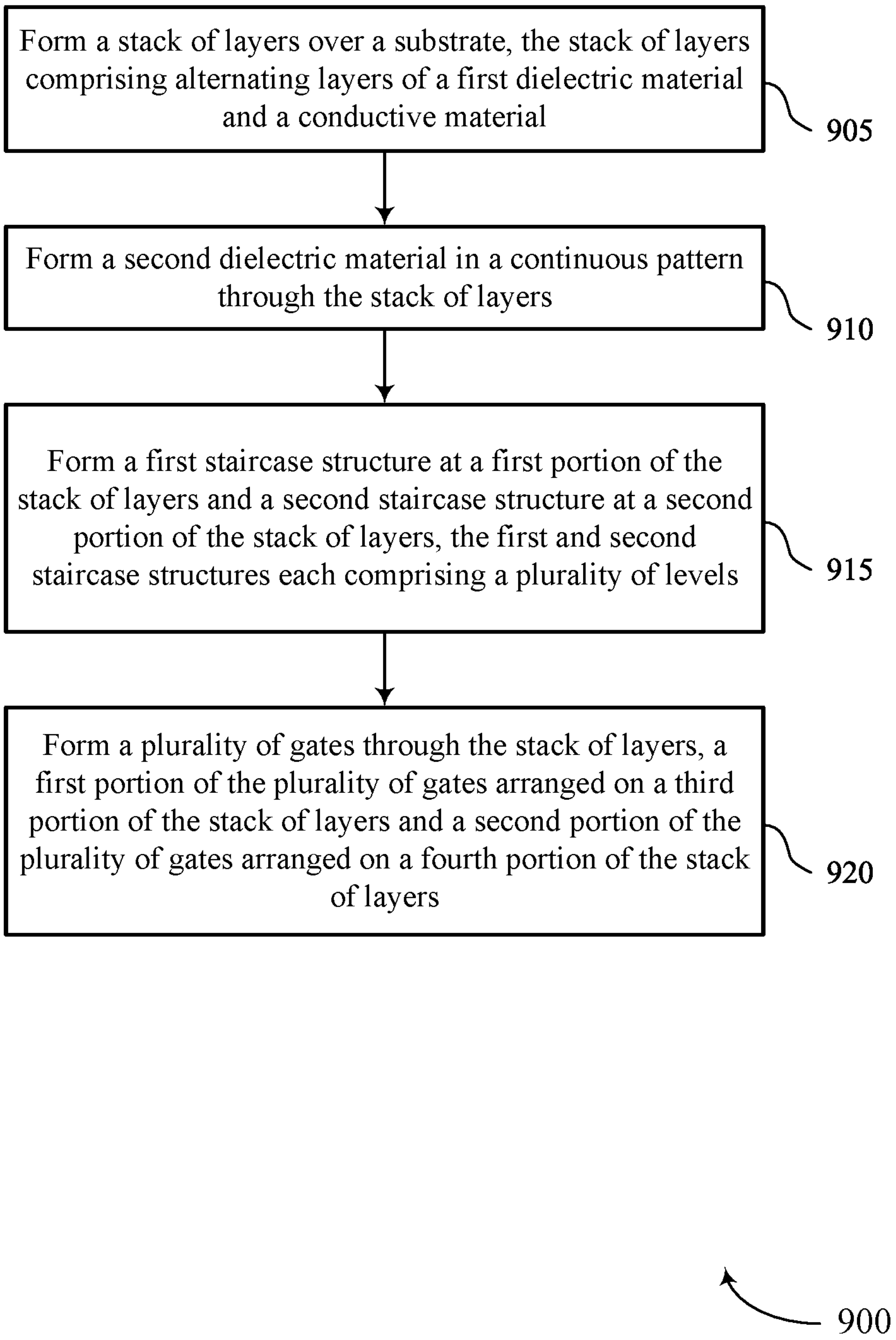
FIG. 9 shows a flowchart illustrating a method or methods that support staggered horizontal cell architecture for memory devices in accordance with examples as disclosed herein.

FIG. 9 shows a flowchart illustrating a method 900 that supports staggered horizontal cell architecture for memory devices in accordance with examples as disclosed herein. The operations of method 900 may be implemented by an apparatus (e.g., a manufacturing system) or its components as described herein. For example, the operations of method 900 may be performed by a manufacturing system as described with reference to FIGS. 1 through 8. In some examples, a manufacturing system may execute a set of instructions to control the functional elements of the device to perform the described functions. Additionally, or alternatively, the manufacturing system may perform aspects of the described functions using special-purpose hardware.

At 905, the method may include forming (e.g., depositing) a stack of layers over a substrate, the stack of layers including alternating layers of a first dielectric material and a conductive material. The operations of 905 may be performed in accordance with examples as disclosed herein.

At 910, the method may include forming a second dielectric material in a continuous pattern through the stack of layers. The operations of 910 may be performed in accordance with examples as disclosed herein.

At 915, the method may include forming (e.g., etching) a first staircase structure at a first portion of the stack of layers and a second staircase structure at a second portion of the stack of layers, the first and second staircase structures each including a plurality of levels. The operations of 915 may be performed in accordance with examples as disclosed herein.

At 920, the method may include forming a plurality of gates through the stack of layers, a first portion of the plurality of gates arranged on a third portion of the stack of layers and a second portion of the plurality of gates arranged on a fourth portion of the stack of layers. The operations of 920 may be performed in accordance with examples as disclosed herein.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, or instructions, or any combination thereof for forming a stack of layers over a substrate, the stack of layers including alternating layers of a first dielectric material and a conductive material; forming a second dielectric material in a continuous pattern through the stack of layers; forming a first staircase structure at a first portion of the stack of layers and a second staircase structure at a second portion of the stack of layers, the first and second staircase structures each including a plurality of levels; and forming a plurality of gates through the stack of layers, a first portion of the plurality of gates arranged on a third portion of the stack of layers and a second portion of the plurality of gates arranged on a fourth portion of the stack of layers.

Aspect 2: The method, apparatus, or non-transitory computer-readable medium of aspect 1 where forming the second dielectric material includes operations, features, circuitry, logic, or instructions, or any combination thereof for etching a serpentine pattern through the stack of layers and depositing the second dielectric material in the etched serpentine pattern.

Aspect 3: The method, apparatus, or non-transitory computer-readable medium of any of aspects 1 through 2, further including operations, features, circuitry, logic, or instructions, or any combination thereof for depositing the second dielectric material over the first staircase structure and over the second staircase structure based at least in part on etching the first staircase structure and the second staircase structure.

Aspect 4: The method, apparatus, or non-transitory computer-readable medium of any of aspects 1 through 3, further including operations, features, circuitry, logic, or instructions, or any combination thereof for forming a plurality of structural lines through the stack of layers, where forming the plurality of gates is based at least in part on forming the plurality of structural lines.

Aspect 5: The method, apparatus, or non-transitory computer-readable medium of any of aspects 1 through 4, further including operations, features, circuitry, logic, or instructions, or any combination thereof for forming a portion of a capacitor using one or more layers of the conductive material based at least in part on forming the plurality of gates.

Aspect 6: The method, apparatus, or non-transitory computer-readable medium of any of aspects 1 through 5, further including operations, features, circuitry, logic, or instructions, or any combination thereof for forming a plurality of access line contacts, each access line contact corresponding to a respective level of the plurality of levels or to a respective gate of the plurality of gates.

Aspect 7: The method, apparatus, or non-transitory computer-readable medium of any of aspects 1 through 6, further including operations, features, circuitry, logic, or instructions, or any combination thereof for depositing a second stack of layers over a second substrate, the second stack of layers including alternating layers of the first dielectric material and the conductive material; forming the second dielectric material in the continuous pattern through the second stack of layers; etching a third staircase structure at a first portion of the second stack of layers and a fourth staircase structure at a second portion of the second stack of layers, where the third and fourth staircase structures each includes a respective plurality of levels; and forming a second plurality of gates through the second stack of layers, a first portion of the second plurality of gates arranged on a third portion of the second stack of layers and a second portion of the second plurality of gates arranged on a fourth portion of the second stack of layers.

Aspect 8: The method, apparatus, or non-transitory computer-readable medium of aspect 7 where the first portion of the plurality of gates is offset from the first portion of the second plurality of gates.

Aspect 9: The method, apparatus, or non-transitory computer-readable medium of any of aspects 1 through 8 where the first portion of the plurality of gates are coupled with the first staircase structure and the second portion of the plurality of gates are coupled with the second staircase structure.

Aspect 10: The method, apparatus, or non-transitory computer-readable medium of any of aspects 1 through 9 where the third portion of the stack of layers includes a first edge of the stack of layers and the fourth portion of the stack of layers includes a second edge of the stack of layers, the first edge opposite the second edge.

Aspect 11: The method, apparatus, or non-transitory computer-readable medium of any of aspects 1 through 10 where the first dielectric material includes an oxide material.

Aspect 12: The method, apparatus, or non-transitory computer-readable medium of any of aspects 1 through 11 where the first conductive material includes a polysilicon layer.

Aspect 13: The method, apparatus, or non-transitory computer-readable medium of any of aspects 1 through 12 where the second dielectric material includes an oxide material.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a first staircase structure at a first portion of a stack of layers and a second staircase structure at a second portion of the stack of layers opposite the first portion, the first and second staircase structures each including a plurality of levels; a plurality of access lines having a first portion coupled with a third portion of the stack of layers and having a second portion of the plurality of access lines coupled with a fourth portion of the stack of layers opposite the third portion of the stack of layers; and a plurality of gates having a first portion arranged on the third portion of the stack of layers and having a second portion arranged on the fourth portion of the stack of layers opposite the third portion of the stack of layers, each access line corresponding to a respective gate of the plurality of gates.

Aspect 15: The apparatus of aspect 14, further including: a first dielectric material formed in a continuous pattern through the stack of layers.

Aspect 16: The apparatus of aspect 15, where the continuous pattern includes a serpentine pattern.

Aspect 17: The apparatus of any of aspects 14 through 16, further including: a plurality of structural lines through the stack of layers, the plurality of structural lines coupled with the plurality of access lines.

Aspect 18: The apparatus of any of aspects 14 through 17, further including: a plurality of contacts, each contact of the plurality of contacts coupled with a respective level of the plurality of levels or a respective gate of the plurality of gates.

Aspect 19: The apparatus of any of aspects 14 through 18, where the third portion of the stack of layers includes a first edge of the stack of layers and the fourth portion of the stack of layers includes a second edge of the stack of layers, the first edge opposite the second edge.

An apparatus is described. The following provides an overview of aspects of the apparatus as described herein:

Aspect 20: An apparatus including a memory array, the apparatus including: a first staircase structure of a stack of layers having a plurality of levels; a first fin including a plurality of gates coupled with the first staircase structure and extending in a first direction; and a second fin including a second plurality of gates coupled with the first staircase structure and extending in a second direction opposite the first direction.

Aspect 21: The apparatus of aspect 20, further including: a second staircase structure having a second plurality of levels; a third fin including a third plurality of gates coupled with the second staircase structure and extending in the first direction; and a fourth fin including a fourth plurality of gates coupled with the second staircase structure and extending in the second direction opposite the first direction, where the third plurality of gates and fourth plurality of gates are offset in a third direction from the first plurality of gates and the second plurality of gates.

Aspect 22: The apparatus of aspect 21, further including: a first cap structure at a first end of the memory array and a second cap structure at a second end of the memory array.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms “electronic communication,” “conductive contact,” “connected,” and “coupled” may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term “coupling” refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term “isolated” refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term “layer” or “level” used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms “if” “when,” “based on,” or “based at least in part on” may be used interchangeably. In some examples, if the terms “if” “when,” “based on,” or “based at least in part on” are used to describe a conditional action, a conditional process, or connection between portions of a process, the terms may be interchangeable.

Additionally, the terms “directly in response to” or “in direct response to” may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed “based on,” “based at least in part on,” or “in response to” some other step, action, event, or condition may additionally, or alternatively (e.g., in an alternative example), be performed “in direct response to” or “directly in response to” such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping process or components.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be “on” or “activated” if a voltage greater than or equal to the transistor’s threshold voltage is applied to the transistor gate. The transistor may be “off” or “deactivated” if a voltage less than the transistor’s threshold voltage is applied to the transistor gate.

The description set forth herein, in connection with the appended drawings, describes example configurations and does not represent all the examples that may be implemented or that are within the scope of the claims. The term “exemplary” used herein means “serving as an example, instance, or illustration” and not “preferred” or “advantageous over other examples.” The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

forming a stack of layers over a substrate, the stack of layers comprising alternating layers of a first dielectric material and a conductive material;

forming a second dielectric material in a continuous pattern through the stack of layers;

forming a first staircase structure at a first portion of the stack of layers and a second staircase structure at a second portion of the stack of layers, the first and second staircase structures each comprising a plurality of levels;

forming a plurality of gates through the stack of layers, a first portion of the plurality of gates arranged on a third portion of the stack of layers and a second portion of the plurality of gates arranged on a fourth portion of the stack of layers.

2. The method of claim 1, wherein forming the second dielectric material comprises:

etching a serpentine pattern through the stack of layers; and depositing the second dielectric material in the etched serpentine pattern.

3. The method of claim 1, further comprising:

depositing the second dielectric material over the first staircase structure and over the second staircase structure based at least in part on etching the first staircase structure and the second staircase structure.

4. The method of claim 1, further comprising:

forming a plurality of structural lines through the stack of layers, wherein forming the plurality of gates is based at least in part on forming the plurality of structural lines.

5. The method of claim 1, further comprising:

forming a portion of a capacitor using one or more layers of the conductive material based at least in part on forming the plurality of gates.

6. The method of claim 1, further comprising:

forming a plurality of access line contacts, each access line contact corresponding to a respective level of the plurality of levels or to a respective gate of the plurality of gates.

7. The method of claim 1, further comprising:

depositing a second stack of layers over a second substrate, the second stack of layers comprising alternating layers of the first dielectric material and the conductive material;

forming the second dielectric material in the continuous pattern through the second stack of layers;

etching a third staircase structure at a first portion of the second stack of layers and a fourth staircase structure at a second portion of the second stack of layers, wherein the third and fourth staircase structures each comprises a respective plurality of levels; and forming a second plurality of gates through the second stack of layers, a first portion of the second plurality of gates arranged on a third portion of the second stack of layers and a second portion of the second plurality of gates arranged on a fourth portion of the second stack of layers.

8. The method of claim 7, wherein the first portion of the plurality of gates is offset from the first portion of the second plurality of gates.

9. The method of claim 1, wherein:

the first portion of the plurality of gates are coupled with the first staircase structure; and the second portion of the plurality of gates are coupled with the second staircase structure.

10. The method of claim 1, wherein the third portion of the stack of layers comprises a first edge of the stack of layers and the fourth portion of the stack of layers comprises a second edge of the stack of layers, the first edge opposite the second edge.

11. The method of claim 1, wherein the first dielectric material comprises an oxide material.

12. The method of claim 1, wherein the first conductive material comprises a poly-silicon layer.

13. The method of claim 1, wherein the second dielectric material comprises an oxide material.

14. An apparatus, comprising:

a first staircase structure at a first portion of a stack of layers and a second staircase structure at a second portion of the stack of layers opposite the first portion, the first and second staircase structures each comprising a plurality of levels;

a plurality of access lines having a first portion coupled with a third portion of the stack of layers and having a second portion of the plurality of access lines coupled with a fourth portion of the stack of layers opposite the third portion of the stack of layers; and a plurality of gates having a first portion arranged on the third portion of the stack of layers and having a second portion arranged on the fourth portion of the stack of layers opposite the third portion of the stack of layers, each access line corresponding to a respective gate of the plurality of gates.

15. The apparatus of claim 14, further comprising:

a first dielectric material formed in a continuous pattern through the stack of layers.

16. The apparatus of claim 15, wherein the continuous pattern comprises a serpentine pattern.

17. The apparatus of claim 14, further comprising:

a plurality of structural lines through the stack of layers, the plurality of structural lines coupled with the plurality of access lines.

18. The apparatus of claim 14, further comprising:

a plurality of contacts, each contact of the plurality of contacts coupled with a respective level of the plurality of levels or a respective gate of the plurality of gates.

19. The apparatus of claim 14, wherein the third portion of the stack of layers comprises a first edge of the stack of layers and the fourth portion of the stack of layers comprises a second edge of the stack of layers, the first edge opposite the second edge.

20. An apparatus including a memory array, the apparatus comprising:

a first staircase structure of a stack of layers having a plurality of levels of a conductive material;

a first fin comprising a first plurality of gates coupled with the first staircase structure and extending in a first direction, the first fin comprising a plurality of first capacitors, wherein respective subsets of the plurality of first capacitors are coupled with the conductive material of respective levels of the plurality of levels of the staircase structure via respective subsets of the first plurality of gates; and a second fin comprising a second plurality of gates coupled with the first staircase structure and extending in a second direction opposite the first direction, the second fin comprising a plurality of second capacitors, wherein respective subsets of the plurality of second capacitors are coupled with the conductive material of respective levels of the plurality of levels of the staircase structure via respective subsets of the second plurality of gates.

21. The apparatus of claim 20, further comprising:

a second staircase structure having a second plurality of levels;

a third fin comprising a third plurality of gates coupled with the second staircase structure and extending in the first direction; and a fourth fin comprising a fourth plurality of gates coupled with the second staircase structure and extending in the second direction opposite the first direction, wherein the third plurality of gates and fourth plurality of gates are offset in a third direction from the first plurality of gates and the second plurality of gates.

22. The apparatus of claim 21, further comprising:

a first cap structure at a first end of the memory array and a second cap structure at a second end of the memory array.

* * * * *